(12) United States Patent
Archibald et al.

(10) Patent No.: US 8,812,275 B2
(45) Date of Patent: Aug. 19, 2014

(54) MODELING MOVEMENT OF AIR UNDER A FLOOR OF A DATA CENTER

(75) Inventors: Matthew R. Archibald, Morrisville, NC (US); Jerrod K. Buterbaugh, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 508 days.

(21) Appl. No.: 12/885,456

(22) Filed: Sep. 18, 2010

(65) Prior Publication Data

US 2012/0072195 A1 Mar. 22, 2012

(51) Int. Cl.
- *G06F 17/50* (2006.01)
- *G06F 13/10* (2006.01)
- *G06F 11/26* (2006.01)

(52) U.S. Cl.
CPC ............ *G06F 13/105* (2013.01); *G06F 11/261* (2013.01); *G06F 17/50* (2013.01)
USPC .......................... 703/2; 703/1; 703/6; 703/7

(58) Field of Classification Search
None
See application file for complete search history.

(56) References Cited

U.S. PATENT DOCUMENTS

| | | | |
|---|---|---|---|
| 3,065,686 A | 11/1962 | Geocaris | |
| 3,318,225 A | 5/1967 | May | |
| 4,158,875 A | 6/1979 | Tajima et al. | |
| 4,335,647 A | 6/1982 | Timmons | |
| 4,531,454 A | 7/1985 | Spoormaker | |
| 4,775,001 A | 10/1988 | Ward et al. | |
| 5,216,579 A | 6/1993 | Basara et al. | |
| 5,345,779 A | 9/1994 | Feeney | |
| 5,467,609 A | 11/1995 | Feeney | |
| 5,769,702 A | 6/1998 | Hanson | |
| 5,995,368 A | 11/1999 | Lee et al. | |
| 6,183,359 B1 | 2/2001 | Klein et al. | |
| 6,193,601 B1 | 2/2001 | Torczynski | |
| 6,222,729 B1 | 4/2001 | Yoshikawa | |
| 6,318,113 B1 | 11/2001 | Levy et al. | |
| 6,328,776 B1 | 12/2001 | Shanks et al. | |

(Continued)

FOREIGN PATENT DOCUMENTS

| | | |
|---|---|---|
| CN | 101173817 A | 5/2008 |
| CN | 101437385 A | 5/2009 |
| CN | 100533343 C | 8/2009 |
| CN | 201319718 Y | 9/2009 |

OTHER PUBLICATIONS

El-Hakim et al. "Sensor Based Creation of Indoor Virtual Environment Models", 1997.*
Kim et al. "Indoor Spatial Analysis Using Space Syntax", 2008.*

(Continued)

*Primary Examiner* — Shambhavi Patel
(74) *Attorney, Agent, or Firm* — Brandon C. Kennedy; Katherine S. Brown; Biggers Kennedy Lenart Spraggins LLP

(57) ABSTRACT

Methods, systems, and computer program products are provided for modeling movement of air underneath a floor of a data center. Embodiments include receiving, by a management system, from a plurality of environmental condition sensors, environmental condition information corresponding to an area underneath the floor of the data center; in dependence upon the environmental condition information, generating, by the management system, a model representing movement of air within the area underneath the floor of the data center; and indicating, by the management system, physical obstacles underneath the floor of the data center based on the model of the movement of air.

20 Claims, 5 Drawing Sheets

(56) References Cited

U.S. PATENT DOCUMENTS

| | | | |
|---|---|---|---|
| 6,402,613 B1 | 6/2002 | Teagle | |
| 6,491,578 B2 | 12/2002 | Yoshinori et al. | |
| 6,526,702 B2 | 3/2003 | Jones | |
| 6,557,357 B2 | 5/2003 | Spinazzola et al. | |
| 6,574,104 B2* | 6/2003 | Patel et al. | 361/695 |
| 6,574,970 B2 | 6/2003 | Spinazzola et al. | |
| 6,616,524 B2 | 9/2003 | Storck, Jr. et al. | |
| 6,648,752 B2 | 11/2003 | Vernier et al. | |
| 6,672,955 B2 | 1/2004 | Charron | |
| 6,694,759 B1* | 2/2004 | Bash et al. | 62/180 |
| 6,747,872 B1 | 6/2004 | Patel et al. | |
| 6,772,604 B2* | 8/2004 | Bash et al. | 62/259.2 |
| 6,775,997 B2* | 8/2004 | Bash et al. | 62/180 |
| 6,813,897 B1* | 11/2004 | Bash et al. | 62/175 |
| 6,819,563 B1 | 11/2004 | Chu et al. | |
| 6,826,456 B1 | 11/2004 | Irving et al. | |
| 6,832,489 B2* | 12/2004 | Bash et al. | 62/180 |
| 6,832,490 B2* | 12/2004 | Bash et al. | 62/180 |
| 6,834,512 B2* | 12/2004 | Bash et al. | 62/180 |
| 6,854,284 B2* | 2/2005 | Bash et al. | 62/180 |
| 6,862,179 B2 | 3/2005 | Beitelmal et al. | |
| 6,868,683 B2* | 3/2005 | Bash et al. | 62/180 |
| 6,882,531 B2 | 4/2005 | Modica | |
| 6,945,058 B2* | 9/2005 | Bash et al. | 62/89 |
| 6,957,544 B2 | 10/2005 | Dobbs et al. | |
| 7,033,267 B2 | 4/2006 | Rasmussen | |
| 7,050,300 B2 | 5/2006 | Hein | |
| 7,074,123 B2 | 7/2006 | Bettridge et al. | |
| 7,170,745 B2 | 1/2007 | Bash et al. | |
| 7,214,131 B2 | 5/2007 | Malone | |
| 7,226,353 B2 | 6/2007 | Bettridge et al. | |
| 7,251,547 B2 | 7/2007 | Bash et al. | |
| 7,259,963 B2 | 8/2007 | Germagian et al. | |
| 7,266,964 B2 | 9/2007 | Vogel et al. | |
| 7,347,058 B2 | 3/2008 | Malone et al. | |
| 7,361,081 B2 | 4/2008 | Beitelmal et al. | |
| 7,366,632 B2* | 4/2008 | Hamann et al. | 702/130 |
| 7,379,298 B2 | 5/2008 | Walsh et al. | |
| 7,486,511 B1 | 2/2009 | Griffel et al. | |
| 7,568,360 B1 | 8/2009 | Bash et al. | |
| 7,596,476 B2* | 9/2009 | Rasmussen et al. | 703/2 |
| 7,643,291 B2 | 1/2010 | Mallia et al. | |
| 7,644,051 B1* | 1/2010 | Moore et al. | 706/21 |
| 7,656,660 B2 | 2/2010 | Hoeft et al. | |
| 7,726,144 B2* | 6/2010 | Larson et al. | 62/259.2 |
| 7,739,073 B2* | 6/2010 | Hamann et al. | 702/130 |
| 7,756,667 B2* | 7/2010 | Hamann et al. | 702/130 |
| 7,862,410 B2 | 1/2011 | McMahan et al. | |
| 7,864,530 B1* | 1/2011 | Hamburgen et al. | 361/699 |
| 7,869,210 B2 | 1/2011 | Moss | |
| 7,878,889 B2 | 2/2011 | Day | |
| 7,881,910 B2* | 2/2011 | Rasmussen et al. | 703/1 |
| 7,885,795 B2* | 2/2011 | Rasmussen et al. | 703/5 |
| 7,903,407 B2 | 3/2011 | Matsushima et al. | |
| 7,907,402 B2 | 3/2011 | Caveney | |
| 7,957,139 B2 | 6/2011 | Davis et al. | |
| 7,979,250 B2* | 7/2011 | Archibald et al. | 703/5 |
| 7,986,526 B1 | 7/2011 | Howard et al. | |
| 7,991,592 B2* | 8/2011 | VanGilder et al. | 703/1 |
| 8,009,430 B2* | 8/2011 | Claassen et al. | 361/724 |
| 8,054,625 B2 | 11/2011 | Noteboom et al. | |
| 8,090,476 B2* | 1/2012 | Dawson et al. | 700/276 |
| 8,160,838 B2* | 4/2012 | Ramin et al. | 702/188 |
| 8,164,897 B2 | 4/2012 | Graybill et al. | |
| 8,175,753 B2* | 5/2012 | Sawczak et al. | 700/276 |
| 8,229,713 B2* | 7/2012 | Hamann et al. | 703/1 |
| 8,244,502 B2* | 8/2012 | Hamann et al. | 703/1 |
| 8,346,398 B2* | 1/2013 | Ahmed et al. | 700/276 |
| 8,473,265 B2* | 6/2013 | Hlasny et al. | 703/6 |
| 8,560,677 B2* | 10/2013 | VanGilder et al. | 709/224 |
| 8,639,482 B2* | 1/2014 | Rasmussen et al. | 703/5 |
| 8,672,732 B2* | 3/2014 | Rasmussen et al. | 454/184 |
| 2003/0067745 A1 | 4/2003 | Patel et al. | |
| 2005/0159099 A1 | 7/2005 | Malone | |
| 2005/0192680 A1* | 9/2005 | Cascia et al. | 700/29 |
| 2005/0237716 A1 | 10/2005 | Chu et al. | |
| 2005/0267639 A1* | 12/2005 | Sharma et al. | 700/276 |
| 2006/0074609 A1* | 4/2006 | Freeman et al. | 703/1 |
| 2006/0199508 A1 | 9/2006 | Nair et al. | |
| 2006/0260338 A1 | 11/2006 | VanGilder et al. | |
| 2007/0167125 A1 | 7/2007 | Rasmussen et al. | |
| 2007/0173189 A1 | 7/2007 | Lewis | |
| 2008/0204999 A1* | 8/2008 | Clidaras et al. | 361/696 |
| 2008/0269932 A1* | 10/2008 | Chardon et al. | 700/98 |
| 2008/0285232 A1 | 11/2008 | Claassen et al. | |
| 2008/0288193 A1* | 11/2008 | Claassen et al. | 702/61 |
| 2009/0012633 A1* | 1/2009 | Liu et al. | 700/90 |
| 2009/0031896 A1 | 2/2009 | Abraham et al. | |
| 2009/0059523 A1 | 3/2009 | Mallia et al. | |
| 2009/0061755 A1 | 3/2009 | Calder et al. | |
| 2009/0107652 A1 | 4/2009 | VanGilder et al. | |
| 2009/0113323 A1* | 4/2009 | Zhao et al. | 715/764 |
| 2009/0138313 A1* | 5/2009 | Morgan et al. | 705/8 |
| 2009/0150123 A1* | 6/2009 | Archibald et al. | 703/1 |
| 2009/0156114 A1 | 6/2009 | Ahladas et al. | |
| 2009/0168345 A1* | 7/2009 | Martini | 361/691 |
| 2009/0173017 A1 | 7/2009 | Hall | |
| 2009/0259343 A1* | 10/2009 | Rasmussen et al. | 700/282 |
| 2009/0277605 A1 | 11/2009 | VanGilder et al. | |
| 2009/0305625 A1 | 12/2009 | Dawson et al. | |
| 2009/0326879 A1* | 12/2009 | Hamann et al. | 703/2 |
| 2009/0326884 A1* | 12/2009 | Amemiya et al. | 703/6 |
| 2010/0027216 A1 | 2/2010 | Matsushima et al. | |
| 2010/0030528 A1* | 2/2010 | Smith et al. | 703/1 |
| 2010/0035535 A1 | 2/2010 | Taylor | |
| 2010/0041327 A1 | 2/2010 | Desler | |
| 2010/0064610 A1 | 3/2010 | Kulkarni et al. | |
| 2010/0067745 A1 | 3/2010 | Kovtun et al. | |
| 2010/0126696 A1 | 5/2010 | Novotny et al. | |
| 2010/0151781 A1 | 6/2010 | Slessman et al. | |
| 2010/0263830 A1 | 10/2010 | Noteboom et al. | |
| 2011/0189936 A1 | 8/2011 | Haspers et al. | |
| 2011/0205705 A1 | 8/2011 | Graybill et al. | |
| 2011/0246147 A1* | 10/2011 | Rasmussen et al. | 703/2 |
| 2011/0288664 A1 | 11/2011 | Archibald et al. | |
| 2012/0020009 A1 | 1/2012 | Archibald et al. | |
| 2012/0033368 A1 | 2/2012 | Archibald et al. | |
| 2012/0035781 A1 | 2/2012 | Archibald et al. | |
| 2012/0054527 A1* | 3/2012 | Pfeifer et al. | 713/340 |
| 2012/0071992 A1* | 3/2012 | VanGilder et al. | 700/90 |
| 2012/0072195 A1 | 3/2012 | Archibald et al. | |
| 2012/0109404 A1* | 5/2012 | Pandey et al. | 700/299 |
| 2012/0243173 A1 | 9/2012 | Archibald et al. | |
| 2013/0166258 A1* | 6/2013 | Hamann et al. | 703/2 |
| 2013/0178144 A1 | 7/2013 | Archibald et al. | |
| 2013/0200764 A1 | 8/2013 | Archibald et al. | |

OTHER PUBLICATIONS

Papakonstantinou et al. "Air quality in an underground garage: computational and experimental investigation of ventilation effectiveness", Energy and Buildings 35 (2003) 933-940.*

IBM; Automatic Opening Floor Tile for Back-up Air Cooling of Server Racks; IP.Com Prior Art Database; IP.com No. IPCOM000126445D; Jul. 18, 2005.

IBM; Dynamic Thermal Mapping and Trend Analysis as a Control Mechanism for HVAC Systems in Data Centers; IP.Com Prior Art Database; IP.com No. IPCOM000135036D; Mar. 27, 2006.

Disclosed Anonymously; Method for a Managed Airflow Server Cabinet; IP.Com Prior Art Database; IP.com No. IPCOM000135845D; Apr. 26, 2006.

IBM; Apparatus and Method for Measuring Volumetric Airflow Rates for a BlueGene Rack or Rack Assembly with Vertical Airflow; IP.Com Prior Art Database; IP.com No. IPCOM000171776D; Jun. 18, 2008.

IBM; The Cooling Control System of Server; IP.Com Prior Art Database; IP.com No. IPCOM000191308D; Dec. 29, 2009.

IBM, "Automatic Opening Floor Tile for Back-up Air Cooling of Server Racks", IP.Com Prior Art Database, Jul. 18, 2005, pp. 1-5, IP.com No. IPCOM000126445D, IP.com.

IBM, "Dynamic Thermal Mapping and Trend Analysis as a Control Mechanism for HVAC Systems in Data Centers," IP.Com Prior Art

(56) References Cited

OTHER PUBLICATIONS

Database, Mar. 27, 2006, pp. 1-3, IP.com No. IPCOM000135036D, IP.com.

Disclosed Anonymously, "Method for a Managed Airflow Server Cabinet", IP.Com Prior Art Database, Apr. 26, 2006, pp. 1-7, IP.com No. IPCOM000135845D, IP.com.

IBM, "Apparatus and Method for Measuring Volumetric Airflow Rates for a BlueGene Rack or Rack Assembly with Vertical Airflow", IP.Com Prior Art Database, Jun. 18, 2008, pp. 1-9, IP.com No. IPCOM000171776D, IP.com.

IBM, "The Cooling Control System of Server", IP.Com Prior Art Database, Dec. 29, 2009, pp. 1-4, IP.com No. IPCOM000191308D, IP.com.

El-Hakim, S.F., et al., "Sensor Based Creation of Indoor Virtual Environment Models", Proceedings of the 1997 International Conference on Virtual Systems and MultiMedia, VSMM '97, Sep. 10-12, 1997, pp. 50-58, IEEE Computer Society, Washington, DC, USA. DOI: 10.1109/VSMM.1997.622327.

Office Action, U.S. Appl. No. 12/851,992, Feb. 21, 2012, pp. 1-9.

Notice of Allowance, U.S. Appl. No. 12/851,992, May 9, 2012, pp. 1-7.

Office Action, U.S. Appl. No. 12/840,863, Jan. 26, 2012, pp. 1-11.

Notice of Allowance, U.S. Appl. No. 12/840,863, Mar. 22, 2012, pp. 1-7.

Office Action, U.S. Appl. No. 12/781,915, Apr. 26, 2013, pp. 1-13.

Final Office Action, U.S. Appl. No. 12/781,915, Oct. 24, 2013, pp. 1-10.

Final Office Action, U.S. Appl. No. 12/852,091, Apr. 23, 2013, pp. 1-11.

Notice of Allowance, U.S. Appl. No. 12/852,091, Aug. 21, 2013, pp. 1-13.

Office Action, U.S. Appl. No. 12/852,091, Nov. 26, 2012, pp. 1-11.

Final Office Action, U.S. Appl. No. 12/885,456, Sep. 10, 2013, pp. 1-9.

Office Action, U.S. Appl. No. 12/885,456, Mar. 19, 2013, pp. 1-20.

\* cited by examiner

MODELING MOVEMENT OF AIR UNDER A FLOOR OF A DATA CENTER

BACKGROUND OF THE INVENTION

1. Field of the Invention

The field of the invention is data processing, or, more specifically, methods, apparatus, and products for modeling of movement of air under a floor of a data center.

2. Description of Related Art

Typical data centers have areas beneath the floor that are used for storage of electrical wires and equipment as well as for the transmission of air conditioning, which is blown from beneath the floor to the data center. The electrical wiring and equipment often act as obstacles for the efficient movement of the air conditioning beneath the floor of the data center. Determining where the obstacles are and how the obstacles are affecting the movement of air beneath the floor can be a difficult and time consuming process. There is therefore an ongoing need to improve the processes for modeling movement of air under a floor of a data center.

SUMMARY OF THE INVENTION

Methods, systems, and computer program products are provided for modeling movement of air underneath a floor of a data center. Embodiments include receiving, by a management system, from a plurality of environmental condition sensors, environmental condition information corresponding to an area underneath the floor of the data center; in dependence upon the environmental condition information, generating, by the management system, a model representing movement of air within the area underneath the floor of the data center; and indicating, by the management system, physical obstacles underneath the floor of the data center based on the model of the movement of air.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
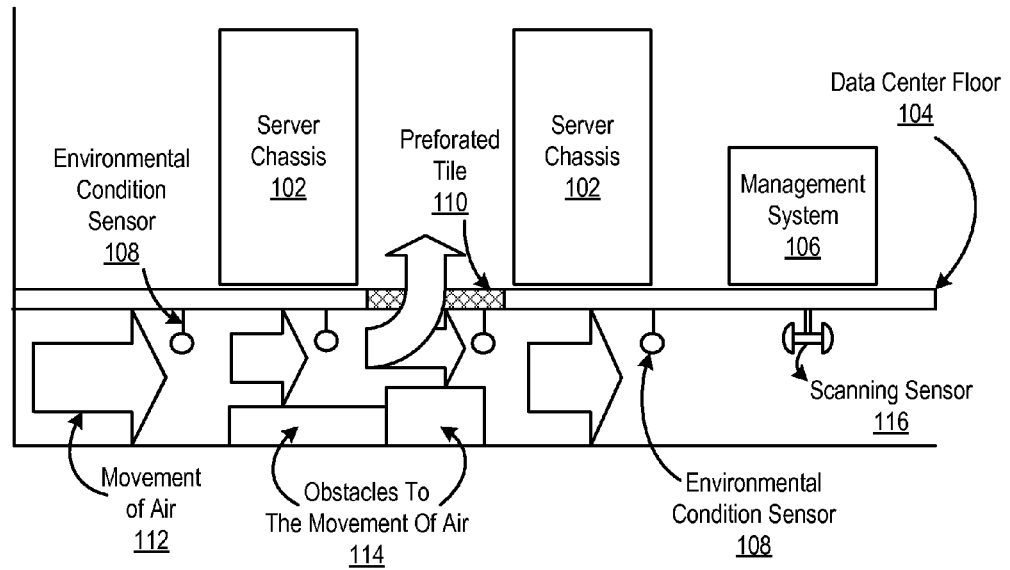
FIG. 1 sets forth a network diagram of a system for modeling movement of air underneath a floor of a data center according to embodiments of the present invention.
Figure 1:
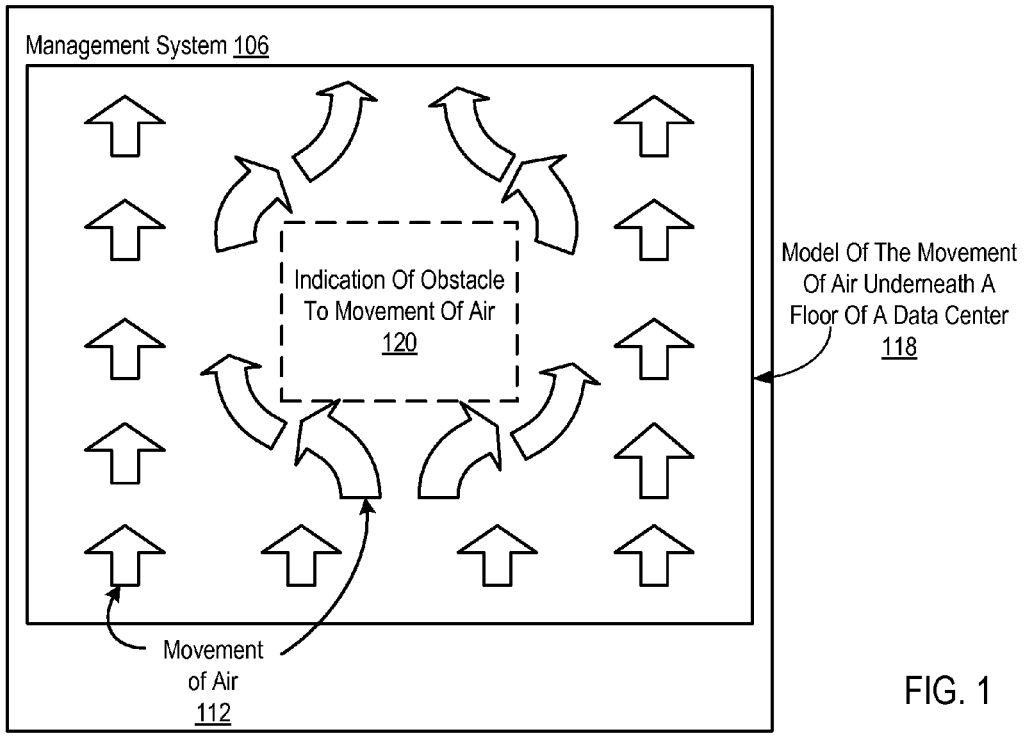

Exemplary methods, apparatus, and products for modeling of movement of air under a floor of a data center in accordance with the present invention are described with reference to the accompanying drawings, beginning with FIG. 1. FIG. 1 sets forth a network diagram of a system for modeling movement of air underneath a floor of a data center according to embodiments of the present invention. The system of FIG. 1 is a data center. A data center is a centralized repository, either physical or virtual, for the storage, management, and dissemination of data and information typically organized around a particular subject or pertaining to a particular business. A data center may exist within an organization's facilities or may be maintained as a specialized facility. Data centers vary in size from buildings of servers to server rooms to even computer closets.

The data center of FIG. 1 includes server chassis (102) and a management system (106) on the floor (104) of the data center. The server chassis (102) may include servers and other electrical equipment that generate heat. To cool the electrical equipment and in general to provide air conditioning for the data center, cool air is channeled in an area underneath the floor (104) of the data center and into the data center through perforated tiles (110). The area underneath the floor (104) may also be used to store electrical wires and other components, which creates obstacles (114) to the movement (112) of air underneath the floor (104) of the data center.

To determine the location of the obstacles (114), the management system (106) of FIG. 1 uses information generated from a plurality of environmental condition sensors (108). Each environmental condition sensor (108) of FIG. 1 detects environmental conditions for an area underneath the floor (104) of the data center and generates environmental condition information for transmission to the management system (106). The type of environmental condition information generated by the environmental condition sensors (108) may include a direction and velocity of the movement (112) of air, a temperature of the air, a location of the environmental condition sensor (108), or any other type of environmental information that may be useful for modeling the movement (112) of air underneath the floor (104) of the data center.

The management system (106) of FIG. 1 may also use information generated by one or more scanning sensors (116) to determine the location of the obstacles (114). Each scanning sensor (116) determines a physical geometry of an area underneath the floor (104) of the data center and transmits geometric layout information to the management system (106). The scanning sensor (116) may use a scanning laser to determine the physical geometry of the area by scanning at multiple angles and at multiple heights. The scanning sensor (116) may apply triangulation and phase shift methods on data from the scans to calculate distances of objects underneath the floor. Triangulation is the process of determining the location of a point by measuring angles to it from known points at either end of a fixed baseline, rather than measuring distances to the point directly. The point can then be fixed as the third point of a triangle with one known side and two known angles.

The environmental condition sensors (108) and the scanning sensors (116) may be attached to the floor (104) of the data center, embedded into the tiles of the floor (104), placed on the ground below the floor (104) of the data center, or located in other ways as will occur to those of skill in the art. The environmental condition sensors (108) may be separate from the scanning sensors (116) as illustrated in FIG. 1 or may be incorporated into a multi-function sensor (not shown)

that generates both environmental condition information and geometric layout information. The environmental condition sensors (108) and scanning sensors (116) of FIG. 1 may transmit the environmental condition information and the geometric layout information to the management system (106) over a direct wire link, a wireless connection, or through a network.

In dependence upon the environmental condition information or the geometric layout information received, respectively, from the environmental condition sensors (108) or the scanning sensors (116), the management system (106) models the movement (112) of air within the area underneath the floor (104) of the data center. Using the generated model (118) of the movement of air, the management system (106) indicates (120) the physical obstacles (114) to the movement (112) of air within the area underneath the floor (104) of the data center. Indicating (120) the physical obstacles (114) may include displaying the model (118) of the movement of air and indicating where in the model (118) the air is not flowing. For example, in the model (118) of FIG. 1, the obstacle is indicated by an outline of dashed lines. The model (118) may also include additional information that a user may use to identify the location of the physical obstacles, such as GPS coordinates, measurements, or other types of location indicators.

Based on the indication (120) of the physical obstacles (114), a user of the management system (106) may decide where to move the physical obstacles (114) or how to modify parameters of the air conditioning system to adjust for the presence of the physical obstacles (114). For example, based on the indication of the physical obstacles (114), the user may increase a velocity of the air, change the direction of the movement of the air, change the location of perforated tiles (110), or remove the physical obstacles (114). By providing a user with an indication of the physical obstacles (114) to the movement of air underneath the floor (104) of the data center, the user may improve the efficiency of the air conditioning system, reduce the power consumption of the data center, and reduce the time spent by the user analyzing and troubleshooting the air conditioning.

The arrangement of servers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Modeling movement of air underneath a floor of a data center in accordance with the present invention is generally implemented with computers, that is, with automated computing machinery. In the system of FIG. 1, for example, the management system (106) is implemented to some extent at least as a computer. For further explanation, therefore, FIG. 2 sets forth a block diagram of automated computing machinery comprising an exemplary management system (106) useful in modeling movement of air underneath a floor of a data center according to embodiments of the present invention. The management system (106) of FIG. 2 includes at least one computer processor (156) or 'CPU' as well as random access memory (168) ('RAM'), which is connected through a high speed memory bus (166) and bus adapter (158) to the processor (156) and to other components of the management system (106).

Stored in RAM (168) is an air movement modeler (202), which is a module of computer program instructions for modeling movement of air underneath a floor of a data center. The air movement modeler (202) of FIG. 2 includes computer program instructions that are capable of receiving, by a management system, from a plurality of environmental condition sensors, environmental condition information corresponding to an area underneath the floor of the data center; in dependence upon the environmental condition information, generating, by the management system, a model representing movement of air within the area underneath the floor of the data center; and indicating, by the management system, physical obstacles underneath the floor of the data center based on the model of the movement of air.

Figure 2:
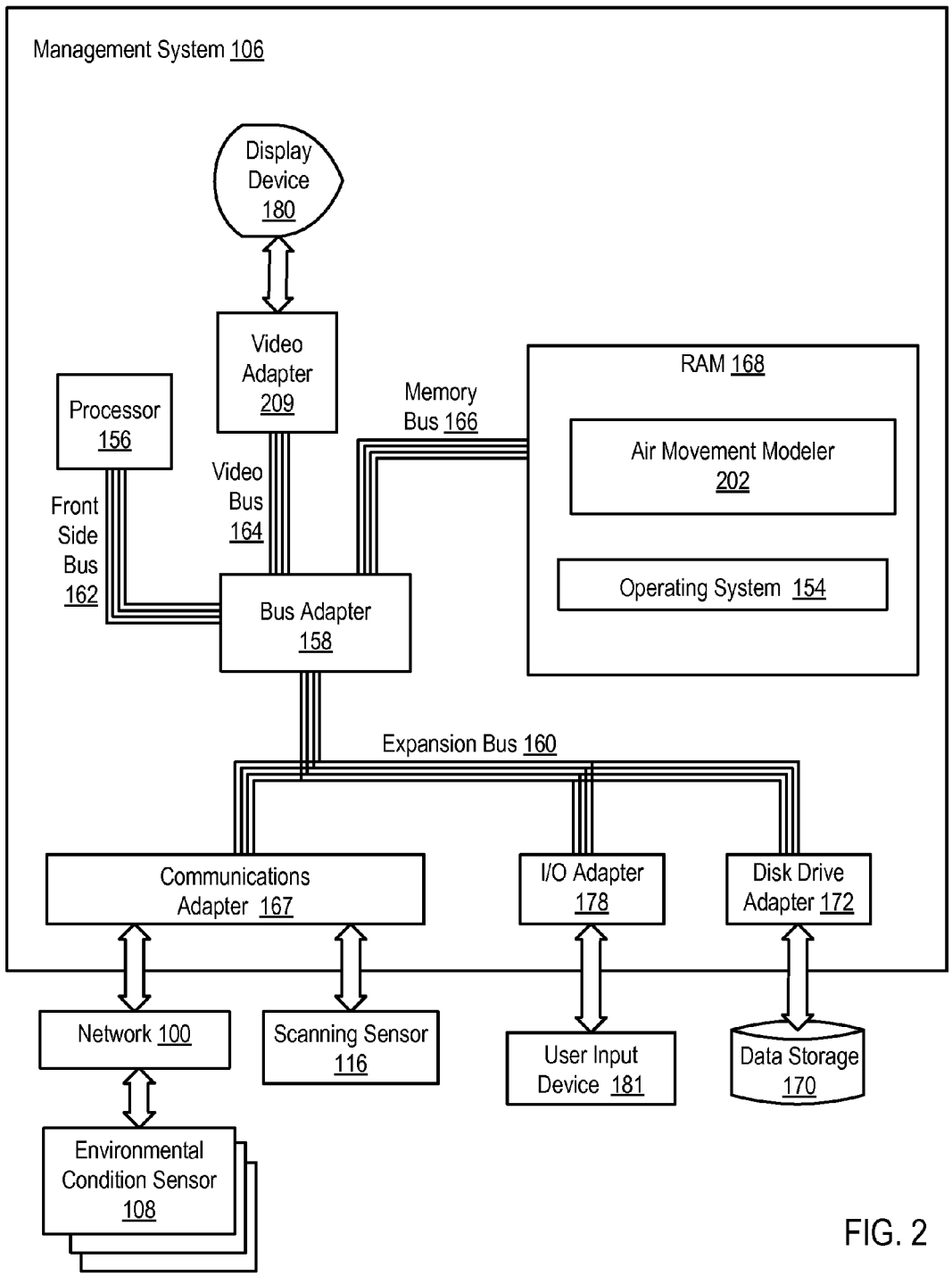
FIG. 2 sets forth a block diagram of automated computing machinery comprising an exemplary management system useful in modeling movement of air underneath a floor of a data center according to embodiments of the present invention.

The air movement modeler (202) of FIG. 2 may also include computer program instructions that are capable of receiving, by the management system, from a scanning sensor, geometric layout information indicating a physical geometry of the area underneath the floor of the data center; and modeling movement of air within the area underneath the floor of the data center in dependence upon the geometric layout information.

Also stored in RAM (168) is an operating system (154). Operating systems useful for modeling movement of air underneath a floor of a data center according to embodiments of the present invention include UNIX™, Linux™, Microsoft XP™, AIX™, IBM's i5/OS™, and others as will occur to those of skill in the art. The operating system (154) and the air movement modeler (202) in the example of FIG. 2 are shown in RAM (168), but many components of such software typically are stored in non-volatile memory also, such as, for example, on a data storage (170).

The management system (106) of FIG. 2 includes disk drive adapter (172) coupled through expansion bus (160) and bus adapter (158) to processor (156) and other components of the management system (106). Disk drive adapter (172) connects non-volatile data storage to the management system (106) in the form of data storage (170). Disk drive adapters useful in computers for modeling movement of air underneath a floor of a data center according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example management system (106) of FIG. 2 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example management system (106) of FIG. 2 includes a video adapter (209), which is an example of an I/O adapter specially designed for graphic output to a display device (180) such as a display screen or computer monitor. The management system (106) of FIG. 2 may use the display device (180) to display a model of the movement of air underneath the floor of a data center and to indicate to a user a physical obstacle to the movement of air underneath the floor of the data center. Video adapter (209) is connected to processor (156) through a high speed video bus (164), bus adapter (158), and the front side bus (162), which is also a high speed bus.

The exemplary management system (106) of FIG. 2 includes a communications adapter (167) for data communications with scanning sensors (116) and for data communications with a data communications network (100) and environmental condition sensors (108). Alternatively, the management system (106) may communicate with the scanning sensors (116) via the network (100) or may communicate with the environmental condition sensors (108) directly via the communications adapter (167). Such data communications may be carried out serially through RS-232 connections, through external buses such as a Universal Serial Bus ('USB'), through data communications data communications networks such as IP data communications networks, and in other ways as will occur to those of skill in the art. Communications adapters implement the hardware level of data communications through which one computer sends data communications to another computer, directly or through a data communications network. Examples of communications adapters useful for modeling movement of air underneath a floor of a data center according to embodiments of the present invention include modems for wired dial-up communications, Ethernet (IEEE 802.3) adapters for wired data communications network communications, and 802.11 adapters for wireless data communications network communications.

Figure 3:
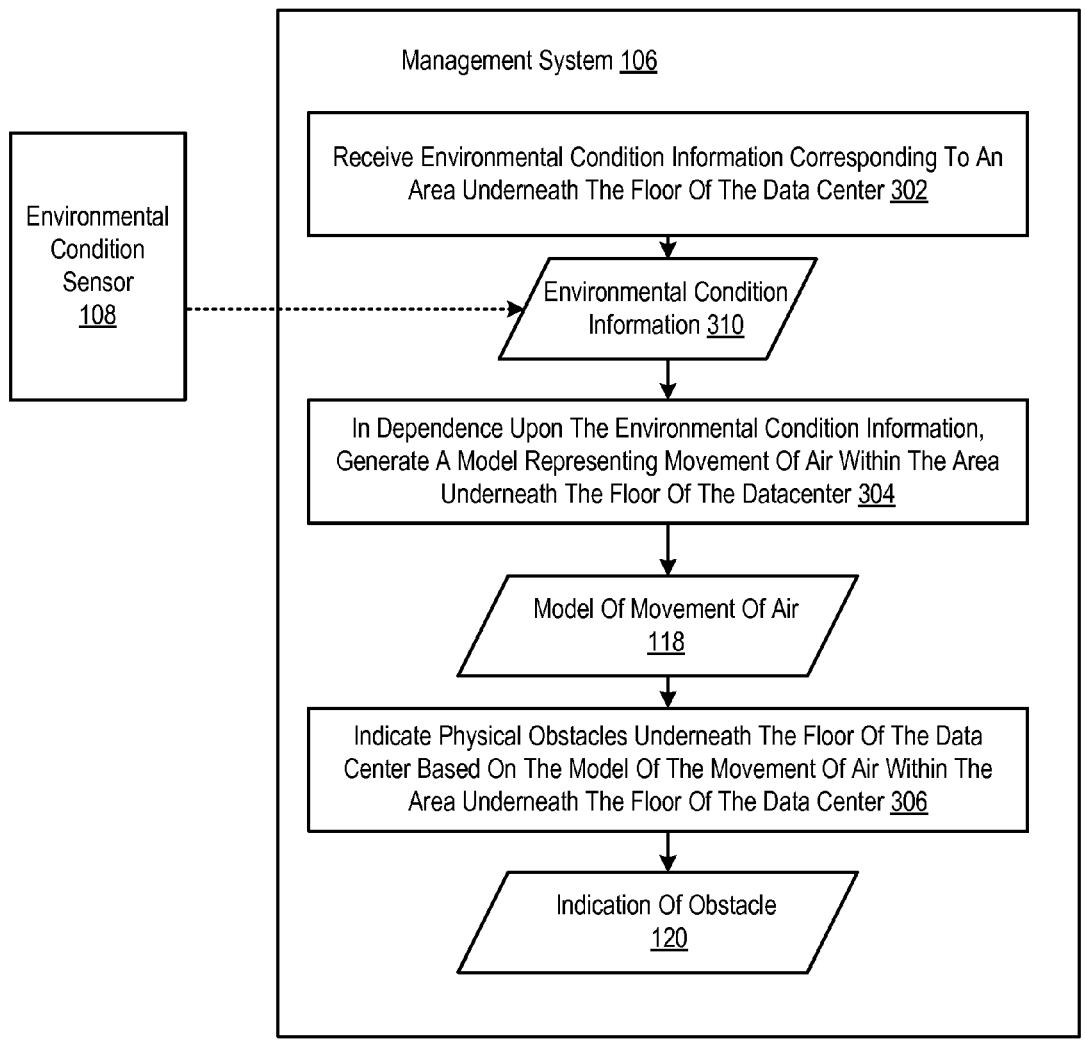
FIG. 3 sets forth a flow chart illustrating an exemplary method for modeling movement of air underneath a floor of a data center according to embodiments of the present invention.

For further explanation, FIG. 3 sets forth a flow chart illustrating an exemplary method for modeling movement of air underneath a floor of a data center according to embodiments of the present invention. The method of FIG. 3 includes receiving (302), by a management system (106), from a plurality of environmental condition sensors (108), environmental condition information (310) corresponding to an area underneath the floor of the data center. Receiving (302) environmental condition information (310) may be carried out by establishing a connection with an environmental condition sensor (108), determining which environmental condition sensor (108) is transmitting, and storing the environmental condition information (310) at a location specific to the identified environmental condition sensor (108).

The method of FIG. 3 includes in dependence upon the environmental condition information, generating (304), by the management system (106), a model (118) representing movement of air within the area underneath the floor of the data center. Generating (304) the model may be carried out by comparing the environmental condition information (310) received from each environmental condition sensor (108), detecting changes in temperature, direction, and velocity between the environmental condition sensors (108), determining how air is moving based on changes between the environmental condition information (310) received from one environmental condition sensor (108) to another environmental condition sensor (108), and building a model (118) that represent the movement of air within the area under the floor of the data center. Generating (304) the model may also include creating pressure and temperature fields, measuring pressure differences, and using computational fluid dynamics (CFD) techniques to evaluate air flow. For example, measuring the pressure differences between two areas indicates a mass flow rate from one area to the next area.

The method of FIG. 3 includes indicating (306), by the management system (106), physical obstacles underneath the floor of the data center based on the model (118) of the movement of air. Indicating (306) the physical obstacles may be carried out by examining the model (118) for areas of decreased velocity or changes in direction of movement of air and displaying the indication (120) of the physical obstacle in a way that indicates to the user that a physical obstacle is obstructing the movement of air.

Figure 4:
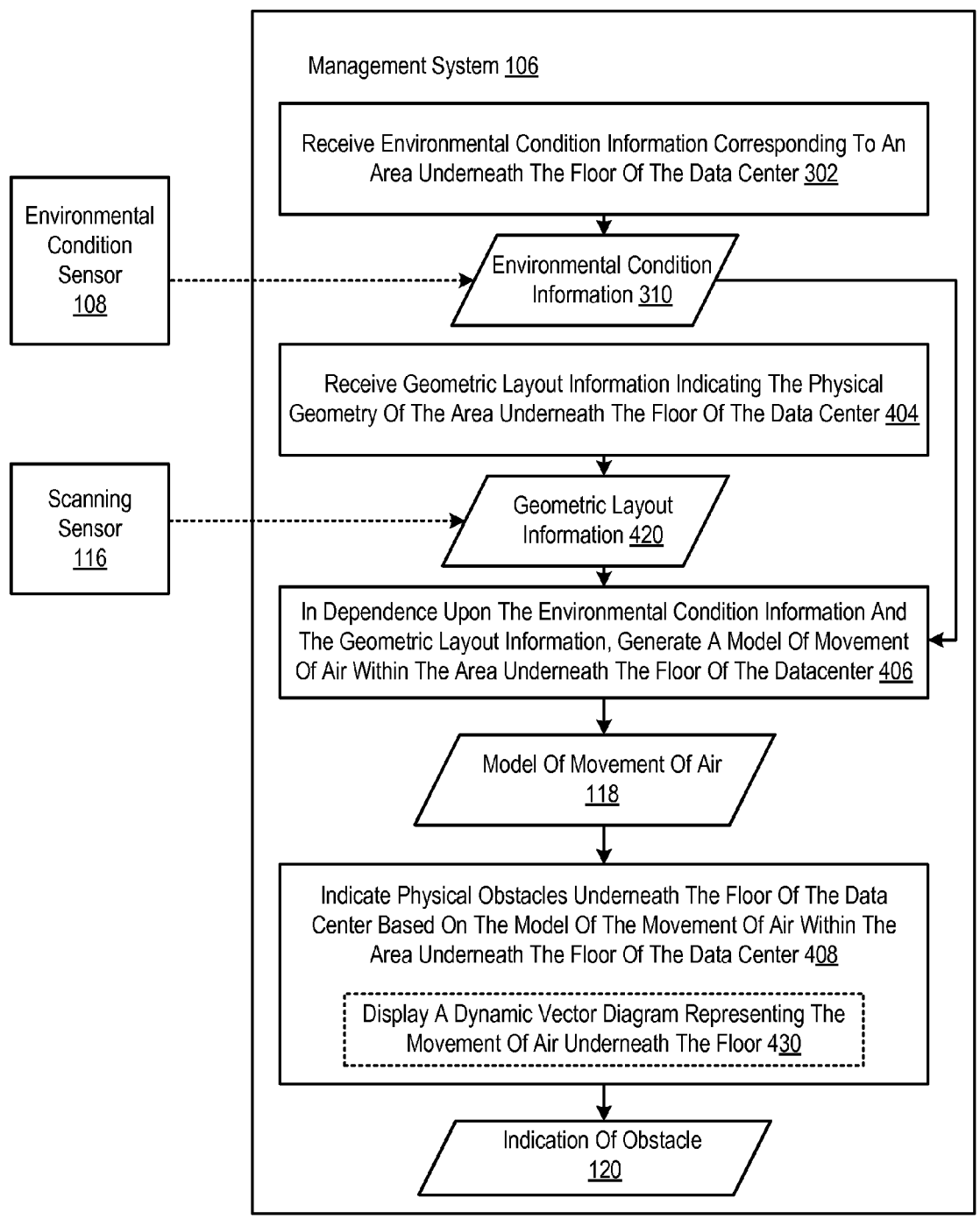
FIG. 4 sets forth a flow chart illustrating a further exemplary method for modeling movement of air underneath a floor of a data center according to embodiments of the present invention.

For further explanation, FIG. 4 sets forth a flow chart illustrating a further exemplary method for modeling movement of air underneath a floor of a data center according to embodiments of the present invention. The method of FIG. 4 includes receiving (302), by a management system (106), from a plurality of environmental condition sensors (108), environmental condition information (310) corresponding to an area underneath the floor of the data center. Receiving (302) environmental condition information (310) may be carried out by establishing a connection with an environmental condition sensor (108), determining which environmental condition sensor (108) is transmitting, and storing the environmental condition information (310) at a location specific to the identified environmental condition sensor (108).

The method of FIG. 4 includes receiving (404), by a management system (106), from a scanning sensor (116), geometric layout information (420) indicating the physical geometry of the area underneath the floor of the data center. Receiving (404) geometric layout information (420) may be carried out by establishing a connection with the scanning sensor (116), determining which scanning sensor (116) is transmitting, and storing the geometric layout information (420) at a location specific to the identified scanning sensor (116).

The method of FIG. 4 includes in dependence upon the environmental condition information (310) and the geometric layout information (420), generating (406) a model (118) representing movement of air within the area underneath the floor of the data center. Generating (406) the model (118) may be carried out by comparing the environmental condition information (310) to the geometric layout information (420) and determining how air is moving based on the environmental condition information (310) and the geometric layout information (420).

The method of FIG. 4 includes indicating (408) physical obstacles underneath the floor of the data center based on the model (118) of the movement of air. Indicating (408) the physical obstacles may be carried out by examining the model (118) for areas of decreased velocity or change in direction of movement of air, examining the model for outlines of obstacles and displaying the indication (120) of the physical obstacle in a way that indicates to the user that a physical obstacle is obstructing the movement of air. Indicating (408) the physical obstacles may optionally include displaying a dynamic vector diagram representing the movement of air underneath the floor of the data center. A dynamic vector diagram is a diagram of vectors, each of which represents movement of air.

Figure 5:
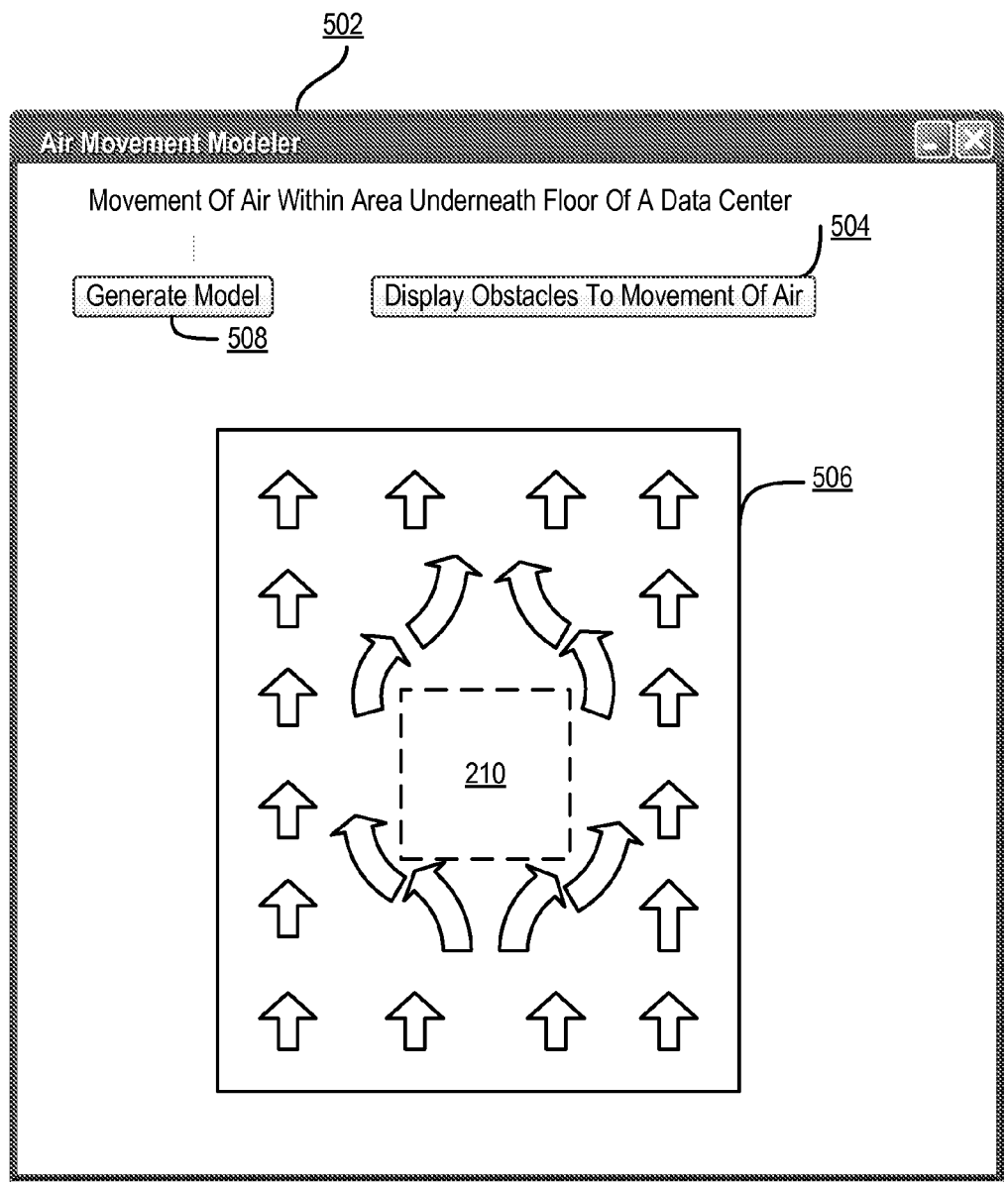
FIG. 5 sets forth a graphical user interface of an air movement modeler for modeling movement of air underneath a floor of a data center according to embodiments of the present invention.

For further explanation, FIG. 5 sets forth a graphical user interface of the air movement modeler of FIG. 2 for modeling movement of air underneath a floor of a data center according to embodiments of the present invention. The graphical user interface (GUI) (502) is an application window that presents a user of a management system (106) with a button to generate a model (508) and a button to display obstacles to movement of air (506). In response to a user clicking the generate model button (508), the management system (106) models the movement of air within an area underneath the floor of a data center based on environmental condition information and geometric layout information received from environmental condition sensors or scanning sensors. In response to a user clicking the display obstacles to movement of air button (504), the GUI (502) determines the physical obstacles and displays the model (506) with the indications (210) of the physical obstacles. The features, buttons, and functions of the GUI (502) are for illustration. A GUI of the air movement modeler may include other buttons, features, and functions useful for the modeling of movement of air under a floor of a data center.

Exemplary embodiments of the present invention are described largely in the context of a fully functional computer system for modeling movement of air underneath a floor of a data center. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of modeling movement of air underneath a floor of a data center, the method comprising:
   receiving, by a management system, from a plurality of environmental condition sensors, environmental condition information corresponding to an area underneath the floor of the data center;
   in dependence upon the environmental condition information, generating, by the management system, a model representing movement of air within the area underneath the floor of the data center; and
   indicating, by the management system, physical obstacles underneath the floor of the data center based on the model of the movement of air, including:
      displaying the model of the movement of air; and
      indicating, within the model, a location of the physical obstacles.

2. The method of claim 1, wherein each environmental condition sensor indicates in the environmental condition information, a direction and velocity of movement of air, a temperature, and a location of the environmental condition sensor.

3. The method of claim 1, further comprising receiving, by the management system, from a scanning sensor, geometric layout information indicating a physical geometry of the area underneath the floor of the data center.

4. The method of claim 3, wherein the geometric layout information is generated by the scanning sensor scanning the area underneath the floor at multiple angles and at multiple heights.

5. The method of claim 3, wherein the geometric layout information is generated by the scanning sensor calculating distances of objects underneath the floor using triangulation and phase shift methods.

6. The method of claim 3, wherein the model is generated in dependence upon the geometric layout information.

7. The method of claim 3, wherein the scanning sensor includes a scanning laser.

8. The method of claim 1, wherein indicating physical obstacles underneath the floor includes displaying, by the management system, a dynamic vector diagram representing the movement of air underneath the floor.

9. The method of claim 1, wherein receiving the environmental condition information includes the management system receiving the environmental condition information wirelessly from an environmental condition sensor.

10. An apparatus for modeling movement of air underneath a floor of a data center, the apparatus comprising a computer processor, a computer memory operatively coupled to the computer processor, the computer memory having disposed within it computer program instructions capable of:
    receiving, by a management system, from a plurality of environmental condition sensors, environmental condition information corresponding to an area underneath the floor of the data center;
    in dependence upon the environmental condition information, generating, by the management system, a model representing movement of air within the area underneath the floor of the data center; and
    indicating, by the management system, physical obstacles underneath the floor of the data center based on the model of the movement of air, including:
       displaying the model of the movement of air; and
       indicating, within the model, a location of the physical obstacles.

11. The apparatus of claim 10, wherein each environmental condition sensor indicates in the environmental condition information, a direction and velocity of movement of air, a temperature, and a location of the environmental condition sensor.

12. The apparatus of claim 10, further comprising computer program instructions capable of receiving, by the management system, from a scanning sensor, geometric layout information indicating a physical geometry of the area underneath the floor of the data center.

13. The apparatus of claim 12, wherein the geometric layout information is generated by the scanning sensor scanning the area underneath the floor at multiple angles and at multiple heights.

14. The apparatus of claim 12, wherein the geometric layout information is generated by the scanning sensor calculating distances of objects underneath the floor using triangulation and phase shift methods.

15. The apparatus of claim 12, wherein the model is generated in dependence upon the geometric layout information.

16. A computer program product for modeling movement of air underneath a floor of a data center, the computer program product disposed upon a computer readable storage medium, wherein the computer readable storage medium is not a signal, the computer program product comprising computer program instructions capable, when executed, of causing a computer to carry out the steps of:
    receiving, by a management system, from a plurality of environmental condition sensors, environmental condition information corresponding to an area underneath the floor of the data center;
    in dependence upon the environmental condition information, generating, by the management system, a model representing movement of air within the area underneath the floor of the data center; and
    indicating, by the management system, physical obstacles underneath the floor of the data center based on the model of the movement of air, including:
       displaying the model of the movement of air; and
       indicating, within the model, a location of the physical obstacles.

17. The computer program product of claim 16, wherein each environmental condition sensor indicates in the environmental condition information, a direction and velocity of movement of air, a temperature, and a location of the environmental condition sensor.

18. The computer program product of claim 16, further comprising computer program instructions capable, when executed, of causing a computer to carry out the steps of receiving, by the management system, from a scanning sensor, geometric layout information indicating a physical geometry of the area underneath the floor of the data center.

19. The computer program product of claim 18, wherein the geometric layout information is generated by the scanning sensor scanning the area underneath the floor at multiple angles and at multiple heights.

20. The computer program product of claim 18, wherein the model is generated in dependence upon the geometric layout information.

* * * * *